United States Patent [19]
Botka et al.

[11] Patent Number: 5,558,541
[45] Date of Patent: Sep. 24, 1996

[54] BLIND MATE CONNECTOR FOR AN ELECTRONIC CIRCUIT TESTER

[75] Inventors: Julius K. Botka; David R. Veteran, both of Santa Rosa, Calif.

[73] Assignee: Hewlett-Packard Company, Palo Alto, Calif.

[21] Appl. No.: 316,970

[22] Filed: Oct. 3, 1994

[51] Int. Cl.⁶ .................................................. H01R 9/07
[52] U.S. Cl. .......................... 439/675; 439/638; 439/248
[58] Field of Search ..................... 324/754; 439/578–585, 439/246–248, 675, 638, 650, 651, 654, 655

[56] References Cited

U.S. PATENT DOCUMENTS

| | | | |
|---|---|---|---|
| 4,333,697 | 6/1982 | Dreyer | 439/638 |
| 4,336,974 | 6/1982 | Wilson | 439/675 |
| 4,355,857 | 10/1982 | Hayward | 439/578 |
| 4,687,279 | 8/1987 | Holland et al. | 439/638 |
| 4,824,399 | 4/1989 | Bogar et al. | 439/578 |
| 4,846,731 | 7/1989 | Alwine | 439/651 |

FOREIGN PATENT DOCUMENTS 2092396  8/1982  United Kingdom ........... H01R 17/04

*Primary Examiner*—David L. Pirlot

[57] ABSTRACT

An electronic circuit tester for measuring the response of electrical signals applied to an electronic circuit under test is provided with a blind mate connector for effecting connection between a test head of the electronic circuit tester and a calibration board or, alternatively, a fixture board coupled to an electronic circuit under test. The blind mate connector includes a body portion having a relieved region at one end, a coaxial center conductor, dielectric material disposed in an interstitial region for supporting the center conductor within the body portion, a coaxial sleeve disposed in the relieved region in electrical contact with the body portion, and a ring to retain the sleeve in the body portion. The blind mate connector is mounted to the calibration or fixture board and mates with a compliant female connector incorporated into the test head. The blind mate connector increases repeatability of connections and facilitates setup and calibration of, and measurements with, the electronic circuit tester.

6 Claims, 5 Drawing Sheets

5,558,541

BLIND MATE CONNECTOR FOR AN ELECTRONIC CIRCUIT TESTER

BACKGROUND OF THE INVENTION

This invention relates to systems for testing electronic circuits by applying and/or measuring electrical signals and, more particularly, to electronic circuit test systems for applying electrical signals to a packaged device or integrated circuit, or a device or integrated circuit chip on wafer, and measuring the response of the device or integrated circuit to the applied electrical signals. Specifically, one embodiment of the invention provides a blind mate connector for effecting an electrical connection(s) in an electronic circuit tester between a test head and a calibration board for the tester or, alternatively, a fixture board that interfaces with the device or integrated circuit being tested. The blind mate connector in accordance with one embodiment of the invention is particularly adaptable to a high-frequency electronic circuit tester for effecting connections between standard coaxial connectors of the test head, such as SMA or 3.5 millimeter connectors, and the calibration board or fixture board for increasing repeatability of connections, as well as for facilitating the setup and calibration of, and measurements with, the tester for testing high-frequency devices and integrated circuits, thereby improving reliability and enhancing overall throughput.

Programmable electronic circuit testers are typically used during the manufacture of electronic devices and integrated circuits to test the performance of the device or integrated circuit being manufactured. Tests are conducted to assure that the device or integrated circuit satisfies associated design performance specifications. In order to test the device or integrated circuit, the electronic circuit tester is programmed to inject an electrical signal or suite of electrical signals into the device or integrated circuit under test and to measure the response(s). The electronic circuit tester cannot only be used to test finished packaged devices and integrated circuits, but is also frequently used to perform tests at various stages of manufacture of the device or integrated circuit between initial wafer processing and final packaging.

A conventional programmable electronic circuit tester, generally indicated by the numeral 10, is shown in FIG. 1. The electronic circuit tester 10 comprises a test head 12 electrically connected by cables routed through a conduit 14 to a rack(s) 16 of electronic test and measurement instruments, such as ac and dc electrical signal generators for applying electrical signals to a device or integrated circuit interfaced to the test head, and signal analyzers, for example, an oscilloscope and a network analyzer, for measuring the response(s) to those applied electrical signals. As shown in FIG. 1, the test head 12 interfaces to a device or integrated circuit through a load board 18 connected to the cables in the conduit 14 and fixture board 20 in turn connected to the load board. Alternatively, prior to installation of the fixture board 20, a calibration board can be connected to the test head 12 for calibrating the test head. The configuration of the load board 18 depends on the type of device or integrated circuit being tested, such as an analog or digital electronic circuit, while the configuration of the fixture board 20 is typically specific to the family of device or integrated circuit being tested.

As shown in FIG. 1, the test head 12 is mounted on a dolly 22. Since the electronic circuit tester 10 can be employed to test both packaged devices and integrated circuits, as well as device or integrated circuit chips on wafer, the test head 12 is preferably mounted by pivotable connections 24 to the dolly 22. The pivotable connections 24 enable the test head 12 to be positioned in an approximately upward facing horizontal position so that the appropriate load board 18 and calibration or fixture board 20 can be mounted on the test head of the electronic circuit tester 10 by an operator. The test head 12 can also be pivoted to a vertical position so that the fixture board 20 can interface with a material handler, for example, to test packaged devices or integrated circuits. Finally, the test head 12 can be pivoted to a downward facing horizontal position so that the fixture board 20 can interface with a wafer to test device or integrated circuit chips on the wafer.

The connectors through which the test head 12 is electrically connected to the calibration or fixture board 20 are subjected to many connections and disconnections during calibration and actual testing with the electronic circuit tester 10. However, the useful life of the electronic circuit tester 10 has heretofore far exceeded the useful life of the connectors in the test head 12 and calibration or fixture board 20. Also, the repeatability of the connections that are effected decreases over time as the connectors degrade due to wear of the connectors. Moreover, high-frequency coaxial connectors are relatively fragile, and the center conductor of such a connector can be damaged if caution is not exercised by the operator when connections are effected.

It would therefore be desirable to provide a connector structure to repeatably connect the test head 12 to the calibration or fixture board 20 over a longer period of the useful life of the electronic circuit tester 10 during setup and calibration and actual testing. Additionally, it is desirable to provide a relatively rugged connector structure whereby the connector is less susceptible to wear and damage when connection is effected. Such a structure would facilitate the use of the electronic circuit tester 10 to perform setup and calibration, as well as the measurement process.

SUMMARY OF THE INVENTION

One embodiment of the invention provides a blind mate connector for interconnecting a test head of an electronic circuit tester and a calibration or fixture board of the tester. That is, a blind mate connector is provided for interconnecting the test head connected to means for applying an electrical signal or suite of electrical signals to, and measuring the response(s) of, an electronic circuit under test and the calibration board or, alternatively, a fixture board coupled to the electronic circuit under test.

In accordance with one embodiment of the invention, the blind mate connector comprises an electrically conductive approximately cylindrical body portion having a central axis and a first inner diameter, the body portion having an interior surface adapted to internally receive an outer conductor of one of a male and female connector at a first end of the body portion and a relieved region at a second end of the body portion, the body portion having a second inner diameter at the relieved portion. The blind mate connector further comprises an electrically conductive approximately cylindrical-solid center conductor having an axis corresponding to the central axis, the center conductor having one of a female and male end juxtaposed with the first end of the body portion and adapted to contact a center conductor of the one of the male and female connector inserted into the first end of the body portion and a male end juxtaposed with the second end of the body portion and adapted to contact a center conductor of a female connector inserted into the second end of the body portion, the center conductor of the blind mate connector having an exterior surface opposite the interior surface of the body portion, the center conductor having a diameter less than the first inner diameter of the body portion to provide an interstitial region between the body portion and the center conductor of the blind mate connector. The blind mate connector additionally comprises dielectric material disposed in the interstitial region for supporting the center conductor of the blind mate connector within the body portion. The blind mate connector also comprises an electrically conductive approximately cylindrical sleeve having an axis corresponding to the central axis, the sleeve having an internal surface and an external surface, the sleeve being disposed in the relieved region at the second end of the body portion in electrical contact with the body portion, the sleeve adapted to contact an outer conductor of the female connector inserted into the second end of the body portion. Finally, the blind mate connector comprises means for retaining the sleeve in the body portion when the sleeve is mounted within the body portion.

In accordance with one implementation of the invention, the first end of the body portion comprises a second relieved region for insertion of the outer conductor of a male connector, and the female end of the center conductor of the blind mate connector is slotted to receive a male pin integral with the center conductor of the male connector when the male connector is inserted, and the blind mate connector further comprises threads on the exterior surface of the first end of the body portion to mate with a coupling nut of the male connector after the male connector is inserted. Also, the interior surface of the body portion, the interior surface of the sleeve, and the exterior surface of the center conductor of the blind mate connector comprise stepped sections, the dielectric material is a cylinder of dielectric material interposed in the interstitial region between the stepped sections of the interior surfaces of the body portion and sleeve, on the one hand, and the exterior surface of the center conductor, on the other hand, to retain the dielectric material, the cylinder of dielectric material having first and second ends, and the first and second ends of the cylinder of dielectric material are relieved to provide inductive compensation for capacitance introduced by the stepped sections of the interior surfaces of the body portion and sleeve and the exterior surface of the center conductor of the blind mate connector. The sleeve preferably comprises a solid cylindrical portion having an outer diameter approximately corresponding to the inner diameter of the relieved region at the second end of the body portion and a slotted portion having an outer diameter smaller than the outer diameter of the solid cylindrical portion of the sleeve and an increased diameter portion for contacting the outer conductor of the female connector inserted into the second end of the body portion. The means for retaining the sleeve comprises a retaining ring having an outer diameter corresponding substantially to the inner diameter of the relieved region of the body portion and disposed within the second end of the body portion at approximately the intersection of the solid cylindrical portion and the slotted portion of the sleeve. Preferably, the interior surface at the second end of the body portion is tapered outwardly to provide a guide for the female connector during insertion into the second end of the body portion of the blind mate connector.

Preferably, the blind mate connector further comprises means for mounting the blind mate connector to the calibration or fixture board comprising an annular flange integral with an exterior surface of the body portion intermediate the first and second ends of the body portion and a threaded section disposed between the flange and one of the first and second ends of the body portion. The threaded section is adapted to be inserted through a hole in the calibration or fixture board until the flange abuts the board and to receive a nut to mount the blind mate connector to the board by sandwiching the board between the flange and the nut. Finally, the female connector inserted into the second end of the body portion is preferably a compliantly mounted connector.

The blind mate connector in accordance with the invention increases repeatability of connections and facilitates setup and calibration of, and measurements with, the electronic circuit tester. This increases the reliability and speed of the measurement process.

BRIEF DESCRIPTION OF THE DRAWINGS

The above and other objects and features and the concomitant advantages of the present invention will be better understood and appreciated by those skilled in the art in view of the description of the preferred embodiments given below in conjunction with the accompanying drawings. In the drawings.

DETAILED DESCRIPTION OF THE PREFERRED EMBODIMENTS

Figure 1:
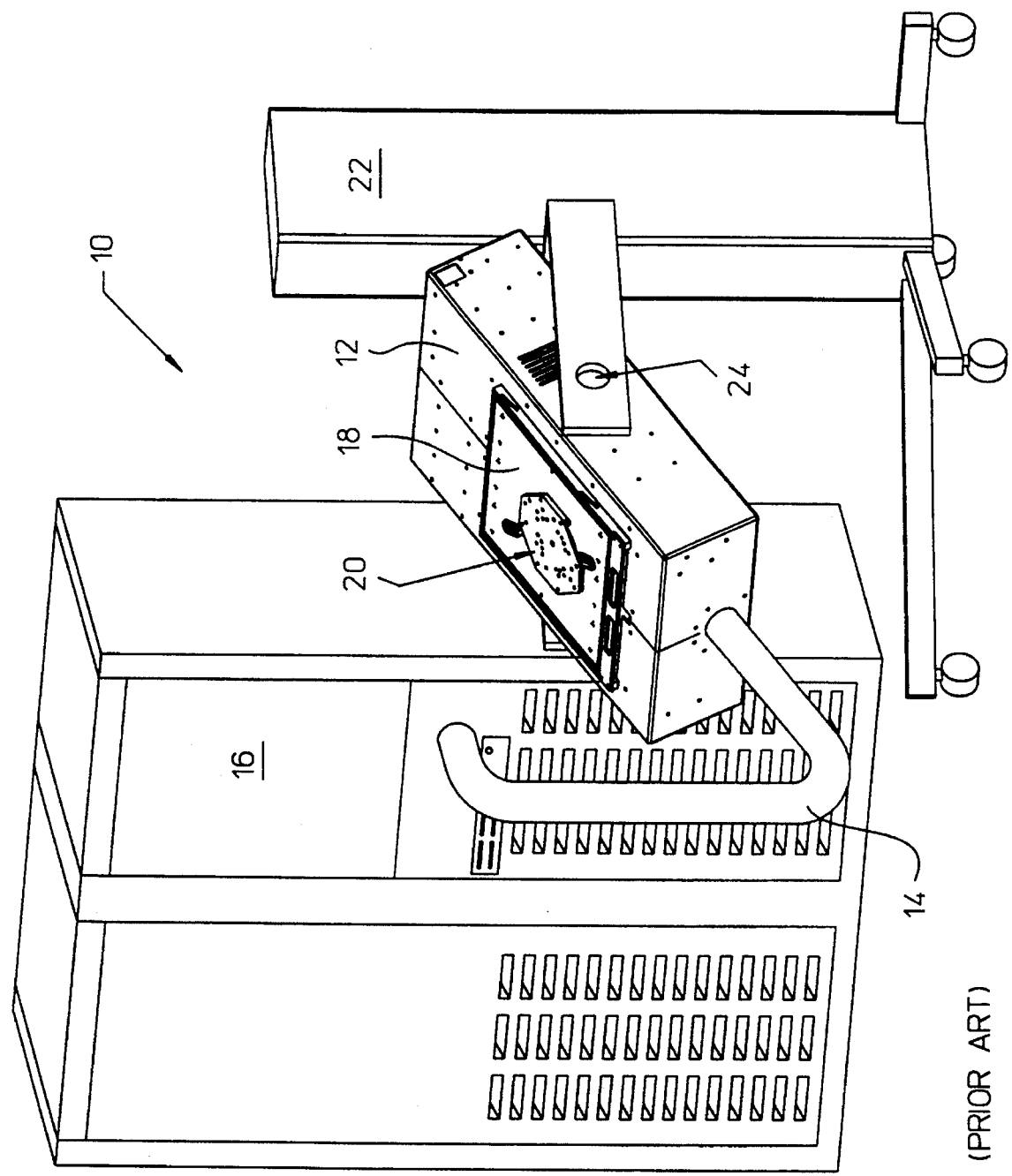
FIG. 1 is an isometric view of a conventional electronic circuit tester.
Figure 2:
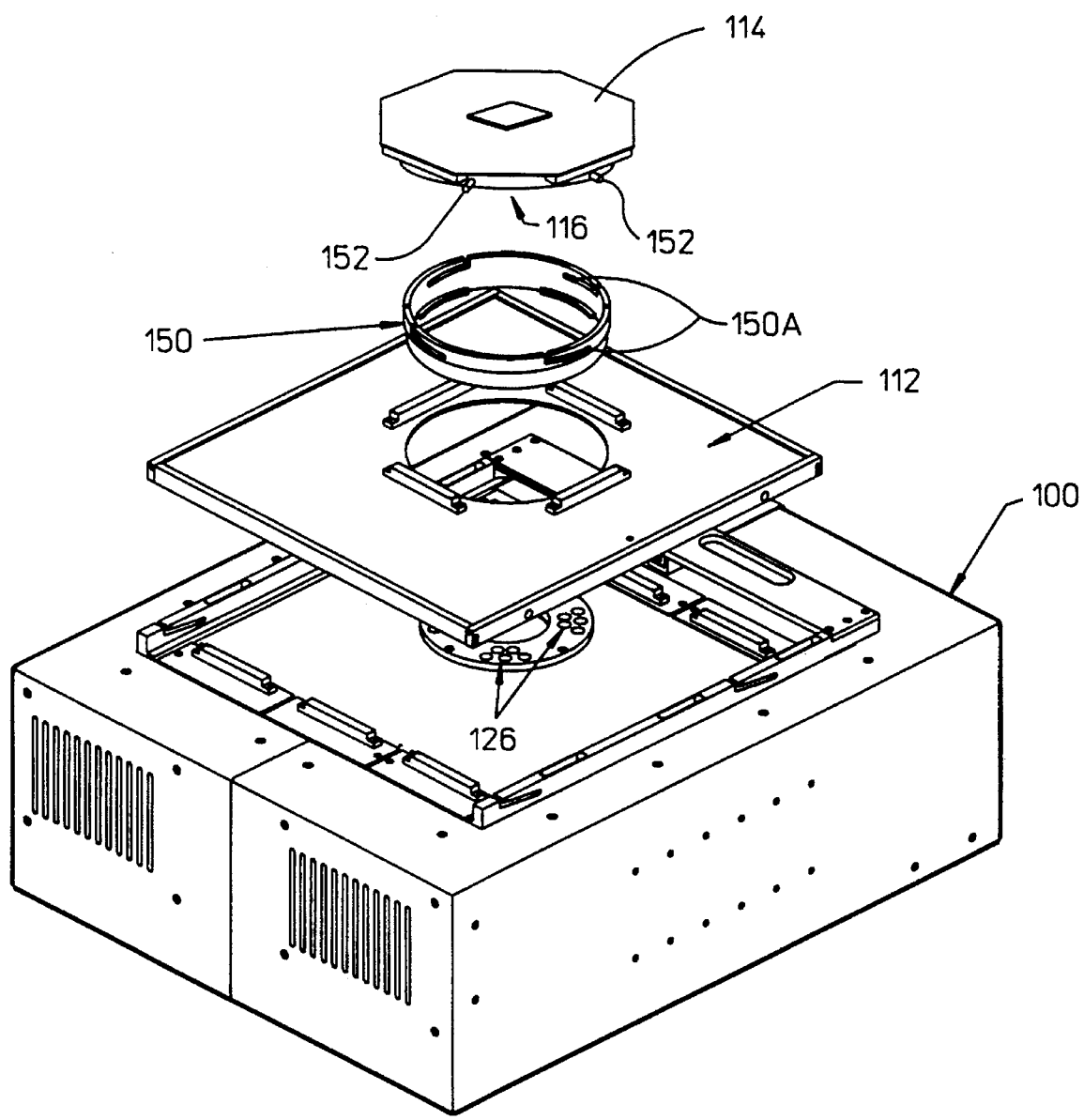
FIG. 2 is an exploded view of a test head, load board, and fixture board in the electronic circuit tester shown in FIG. 1, into which the blind mate connector in accordance with one embodiment of the invention is preferably incorporated.
Figure 4:
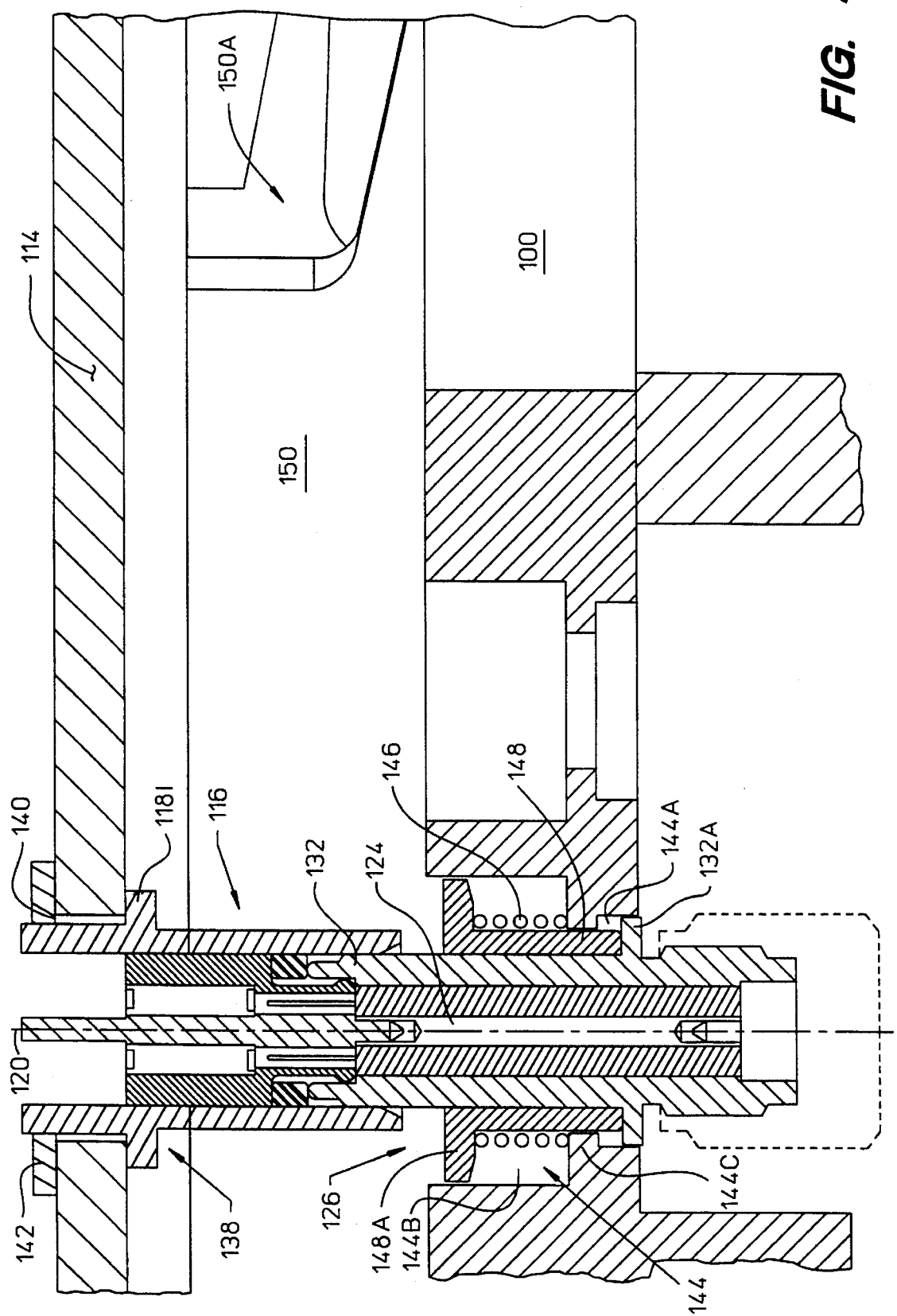
FIG. 4 is a cross-sectional view of a compliant female connector preferably incorporated into a test head of the electronic circuit tester for connection with the blind mate connector in accordance with one embodiment of the invention shown in FIG. 3.

FIG. 2 shows a portion of an electronic circuit tester, namely, a test head 100, a load board 112, and a fixture board 114. In accordance with one embodiment of the invention, a blind mate connector, generally indicated by the numeral 116, is incorporated into the fixture board 114, as best shown in FIG. 4, for interconnecting the test head 100 and the fixture board. Also, the blind mate connector 116 in accordance with the invention can be incorporated into a calibration board (not shown) which is substituted for the fixture board 114 during setup and calibration of the electronic circuit tester.

Figure 3:
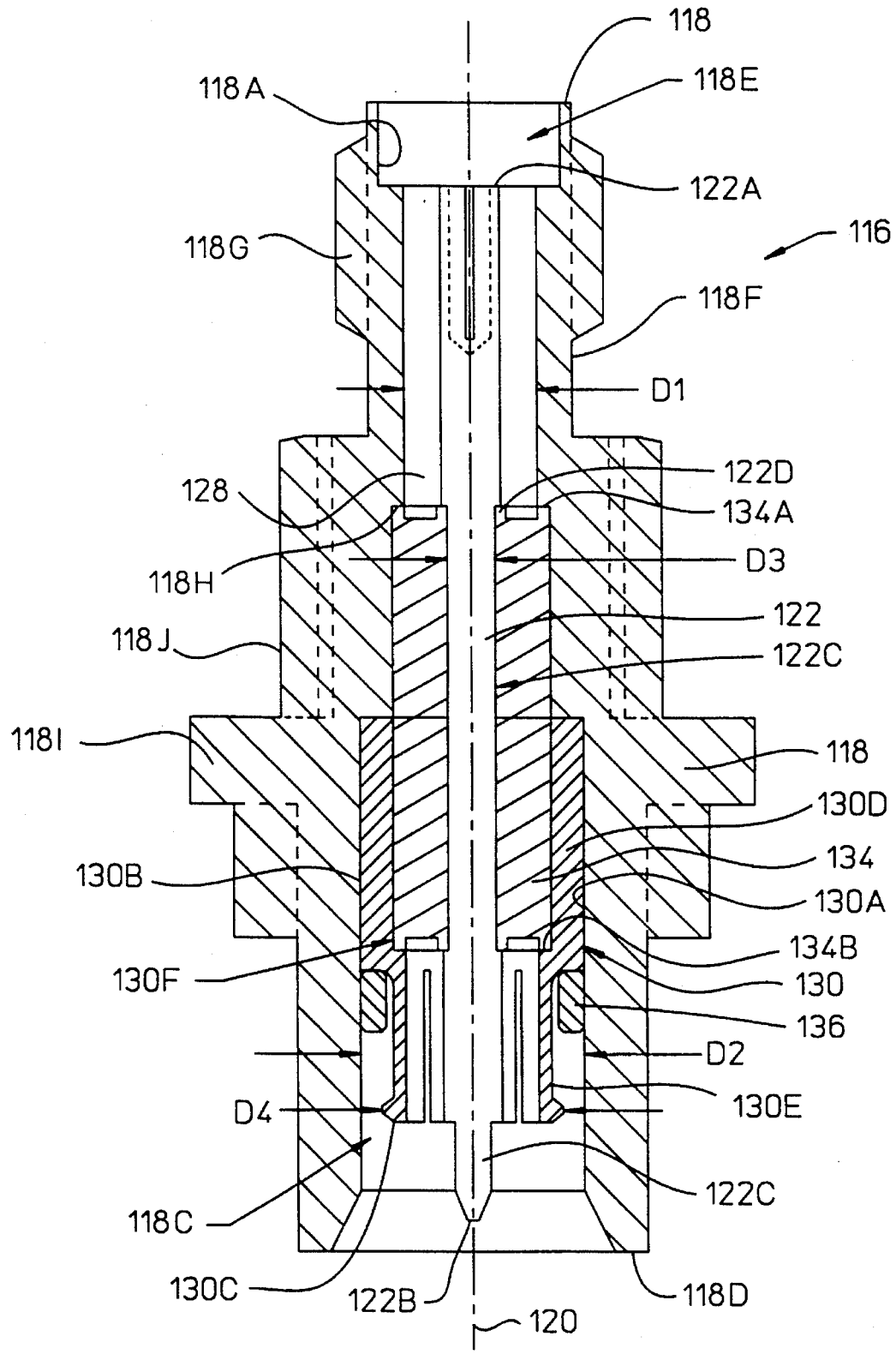
FIG. 3 is a cross-sectional view of a blind mate connector in accordance with one embodiment of the invention.

Considered in more detail, the blind mate connector 116 comprises an electrically conductive approximately cylindrical body portion 118, as shown in FIG. 3. The body portion 118 has a central axis 120. The body portion 118 has a first, or nominal, inner diameter D1. By way of example, the body portion 118 has an interior surface 118A adapted to internally receive an outer conductor of a male connector (not shown) at a first end 118B of the body portion 118. Additionally, the body portion 118 has a relieved region 118C at a second end 118D of the body portion. The body portion 118 has a second inner diameter D2 at the relieved region 118C. Preferably, the interior surface 118A at the second end 118D of the body portion 118 is tapered outwardly to provide a guide for a female connector (not shown in FIG. 3) during insertion into the second end of the body portion.

The blind mate connector 116 further comprises an electrically conductive approximately cylindrical-solid center conductor 122 having an axis corresponding to the central axis 120. By way of example, the center conductor 122 has a female end 122A juxtaposed with the first end 118B of the body portion 118 and adapted to contact a center conductor (not shown) of a male connector (not shown) inserted into the first end of the body portion. The center conductor 122 also has a male end 122B juxtaposed with the second end 118D of the body portion 118 and adapted to contact a center conductor 124 of a female connector 126 inserted into the second end of the body portion, as shown in FIG. 4. The male end 122B of the center conductor 122 preferably comprises a male pin 122C integral with the center conductor 122.

As shown in FIG. 3, the center conductor 122 has an exterior surface 122C opposite the interior surface 118A of the body portion 118. The center conductor 122 has a diameter D3 less than the first inner diameter D1 of the body portion 118 to provide an interstitial region 128 between the body portion and the center conductor.

Preferably, the first end 118B of the body portion 118 comprises a second relieved region 118E for insertion of the outer conductor (not shown) of a male connector (not shown). Additionally, the female end 122A of the center conductor 122 is preferably slotted, as shown in FIG. 3, to receive a male pin (not shown) integral with the center conductor (not shown) of the male connector (not shown) when the male connector is inserted. Also, body portion 118 has an exterior surface 118F comprising threads 118G at the first end 118B of the body portion to mate with a coupling nut (not shown) of the male connector (not shown) after the male connector is inserted into the first end of the body portion.

The blind mate connector 116 also comprises an electrically conductive approximately cylindrical sleeve 130 having an axis corresponding to the central axis 120 and an internal surface 130A and an external surface 130B. The sleeve 130 is disposed in the relieved region 118C at the second end 118D of the body portion 118 in electrical contact with the body portion. An increased diameter portion 130C of the sleeve 130 is adapted to contact an outer conductor 132 of the female connector 126 inserted into the second end 118D of the body portion 118, as shown in FIG. 4. Preferably, the sleeve 130 comprises a solid cylindrical portion 130D having an outer diameter approximately corresponding to the inner diameter D2 of the relieved region 118C at the second end 118D of the body portion 118 and a slotted portion 130E having an outer diameter D4 smaller than the outer diameter of the solid cylindrical portion of the sleeve.

The blind mate connector 116 additionally comprises dielectric material 134 disposed in the interstitial region 128 for supporting the center conductor 122 within the body portion 118. As shown in FIG. 3, each of the interior surface 118A of the body portion 118, the interior surface 130A of the sleeve 130, and the exterior surface 122C of the center conductor 122 preferably comprise stepped sections 118H, 130F, and 122D, respectively. Additionally, the dielectric material 134 is a cylinder of dielectric material interposed in the interstitial region 128 between the respective stepped sections 118H and 130F of the interior surfaces 118A and 130A of the body portion 118 and sleeve 130, on the one hand, and the stepped section 122D of the exterior surface 122C of the center conductor 122, on the other hand, to retain the dielectric material. Also, the cylinder of dielectric material 134 has first and second ends 134A and 134B which are relieved, as shown in FIG. 3, to provide inductive compensation for capacitance introduced by the stepped sections 118H and 130F of the interior surfaces 118A and 130A of the body portion 118 and sleeve 130 and the stepped section 122D of the exterior surface 122C of the center conductor 122.

Finally, the blind mate connector 116 comprises means 136 for retaining the sleeve 130 in the body portion 118 when the sleeve is mounted within the body portion. Preferably, the means 136 for retaining the sleeve 130 comprises a retaining ring having an outer diameter corresponding substantially to the inner diameter D2 of the relieved region 118C of the body portion 118 and disposed within the second end 118D of the body portion at approximately the intersection of the solid cylindrical portion 130D and the slotted portion 130E of the sleeve.

As shown in FIGS. 3 and 4, the blind mate connector 116 preferably comprises means 138 for mounting the blind mate connector to a calibration or fixture board 114. The means 138 for mounting the blind mate connector 116 comprises an annular flange 118I integral with the exterior surface 118F of the body portion 118 intermediate the first and second ends 118B and 118D of the body portion. The means 138 for mounting the blind mate connector 116 also comprises a threaded section 118J of the exterior surface 118F of the body portion 118 disposed between the flange 118I and one of the first and second ends 118B and 118D of the body portion. As shown in FIG. 4, the threaded section 118J is adapted to be inserted through a hole 140 in the calibration or fixture board 114 until the flange 118I abuts the board and to receive a nut 142 to mount the blind mate connector 116 to the board by sandwiching the board between the flange and the nut.

As shown in FIG. 4, the blind mate connector 116 is mounted to the calibration or fixture board 114 and is mated to the female connector 126. Advantageously, the female connector 126 can be a standard SMA or 3.5 millimeter connector. However, the female connector 126 is preferably a compliantly mounted connector, as shown in FIG. 4. Accordingly, the outer conductor 132 of the female connector 126 preferably comprises a skirt 132A that resides in a first portion 144A of a cylinder 144 provided in the test head 100. A spring 146 is disposed in a second portion 144B of the cylinder 144. The first and second portions 144A and 144B of the cylinder 144 are separated by an iris 144C. Finally, a collar 148 is mounted to the outer conductor 132 of the female connector 126 between the outer conductor 132 of the female connector and the spring 146 so that the spring is captured between the iris 144C and a lip 148A of the collar. Consequently, the spring 146 biases the collar 148 and, hence, the female connector 126 away from the iris 144C of the cylinder 144 of the test head 100 toward the blind mate connector 116. Extension of the female connector 126 toward the blind mate connector 116 is limited by the skirt 132A encountering the iris 144C. The female connector 126 moves axially in the first and second cylinder portions 144A and 144B of the cylinder 144 of the test head 100 so that contact is effected between the outer conductor 132 of the female connector and the increased diameter portion 130C of the blind mate connector 116.

In operation, the calibration or fixture board 114 is installed on the test head 100 so that one or more blind mate connectors 116 mate with a corresponding number of female connectors 126. For example, there can be twenty blind mate connectors 116 and corresponding female connectors 126, as shown in FIG. 2. In order to install the calibration or fixture board 114 on the test head 100, the test head preferably comprises a pull down/eject ring 150 having a plurality of slots 150A. The calibration or fixture board 114 preferably comprises pins 152 which interfit in the slots 150A so that rotation of the board causes axial movement of the blind mate connectors 116 toward the female connectors 126 for effecting connection between the board and the test head 100.

The blind mate connector 116 in accordance with one embodiment of the invention provides repeatable interconnection of standard connectors of the test head 100 and the calibration or fixture board 114. Repeatability has been measured at greater than 50 dB to 6.0 GHz. Furthermore, return loss has been measured to be greater than 30 dB to 6.0 GHz.

Figure 5:
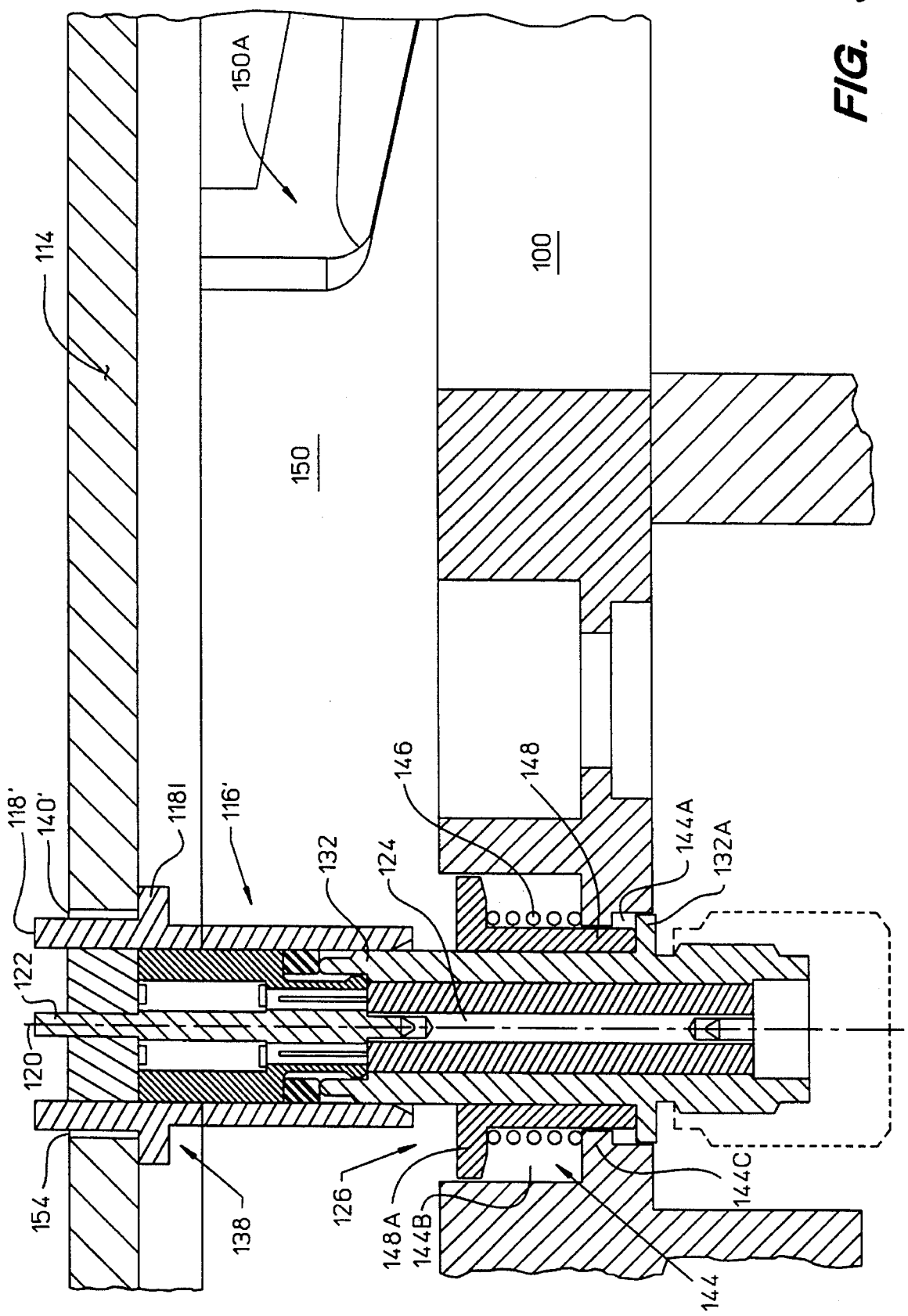
FIG. 5 is a cross-sectional view of an alternative embodiment of the blind mate connector in accordance with the invention.

It will be understood and appreciated that the embodiment of the present invention described above is susceptible to various additional modifications, changes, and adaptations. For example, the first end 118B of the body portion 118 and the female end 122A of the center conductor 122 can alternatively be reconfigured to provide a male connector. Alternatively, as shown in FIG. 5, a connector can be eliminated at the first end 118B of the body portion 118 and the female end 122A of the center conductor 122 of the blind mate connector 116, and respective leads can be soldered directly to a discontinuous, for example, segmented, body portion 118' and the center conductor 122 of a blind mate connector 116'. As shown in FIG. 5, the body portion 118' and the center conductor 122 extend through holes 140' in the calibration or fixture board 114. Also, the flange 118I and threads 118J of the exterior surface 118F of the body portion 118 of the blind mate connector 116 can be eliminated, and solder 154 can be used to mount the blind mate connector 116' to the calibration or fixture board 114. Although the foregoing description discloses an electronic circuit tester which measures high-frequency electrical signals, the principles of the invention also apply in general to connectors. All is intended to be comprehended within the meaning and range of equivalents of the appended claims.

What is claimed is:

1. A blind mate connector comprising:

an electrically conductive approximately cylindrical body portion having a central axis and a first inner diameter, the body portion having an interior surface adapted to internally receive an outer conductor of one of a male and female connector at a first end of the body portion and a relieved region at a second end of the body portion, the body portion having a second inner diameter at the relieved region;

an electrically conductive approximately cylindrical-solid center conductor having an axis corresponding to the central axis, the center conductor having one of a female and male end juxtaposed with the first end of the body portion and adapted to contact a center conductor of the one of the male and female connector inserted into the first end of the body portion and a male end juxtaposed with the second end of the body portion and adapted to contact a center conductor of a female connector inserted into the second end of the body portion, the center conductor of the blind mate connector having an exterior surface opposite the interior surface of the body portion, the center conductor having a diameter less than the first inner diameter of the body portion to provide an interstitial region between the body portion and the center conductor of the blind mate connector;

dielectric material disposed in the interstitial region for supporting the center conductor of the blind mate connector within the body portion;

an electrically conductive approximately cylindrical sleeve having an axis corresponding to the central axis, the sleeve having an internal surface and an external surface the sleeve being disposed in the relieved region at the second end of the body portion in electrical contact with the body portion, the sleave having a solid cylindrical portion having an outer diameter approximately corresponding to the inner diameter of the relieved region at the second end of the body portion and a slotted portion having an outer diameter smaller than the outer diameter of the solid cylindrical portion of the sleeve and an increased diameter portion for contacting an outer conductor of the female connector inserted into the second end of the body portion; and means for retaining the sleeve in the body portion when the sleeve is mounted within the body portion, the means for retaining the sleeve comprising a retaining ring having an outer diameter corresponding substantially to the inner diameter of the relieved region of the body portion and disposed within the second end of the body portion at approximately the intersection of the solid cylindrical portion and the slotted portion of the sleeve.

2. A blind mate connector for interconnecting a test head and a calibration or fixture board in an electronic circuit tester, the connector comprising:

an electrically conductive approximately cylindrical body portion having a central axis and a first inner diameter, the body portion having an interior surface adapted to internally receive an outer conductor of one of a male and female connector at a first end of the body portion and a relieved region at a second end of the body portion, the body portion having a second inner diameter at the relieved region, the body portion also having an exterior surface comprising means for mounting the blind mate connector to the board;

the means for mounting the blind mate connector to the board comprising:

an annular flange integral with the exterior surface of the body portion intermediate the first and second ends of the body portion; and a threaded section disposed between the flange and one of the first and second ends of the body portion;

the threaded section adapted to be inserted through a hole in the board until the flange abuts the board and to receive a nut to mount the blind mate connector to the board by sandwiching the board between the flange and the nut;

an electrically conductive approximately cylindrical-solid center conductor having an axis corresponding to the central axis, the center conductor having one of a female and male end juxtaposed with the first end of the body portion and adapted to contact a center conductor of the one of the male and female connector inserted into the first end of the body portion and a male end juxtaposed with the second end of the body portion and adapted to contact a center conductor of a female connector inserted into the second end of the body portion, the center conductor of the blind mate connector having an exterior surface opposite the interior surface of the body portion, the center conductor having a diameter less than the first inner diameter of the body portion to provide an interstitial region between the body portion and the center conductor of the blind mate connector;

dielectric material disposed in the interstitial region for supporting the center conductor of the blind mate connector within the body portion;

an electrically conductive approximately cylindrical sleeve having an axis corresponding to the central axis, the sleeve having an internal surface and an external surface, the sleeve being disposed in the relieved region at the second end of the body portion in electrical contact with the body portion, the sleeve adapted to contact an outer conductor of the female connector inserted into the second end of the body portion; and means for retaining the sleeve in the body portion when the sleeve is mounted within the body portion.

3. The blind mate connector according to claim 2 wherein the first end of the body portion comprises a second relieved region for insertion of the center conductor of a male connector and the female end of the center conductor of the blind mate connector is slotted to receive a male pin integral with the center conductor of the male connector when the male connector is inserted, further comprising threads on the exterior surface of the first end of the body portion to mate with a coupling nut of the male connector after the male connector is inserted.

4. The blind mate connector according to claim 2 wherein the sleeve comprises a solid cylindrical portion having an outer diameter approximately corresponding to the inner diameter of the relieved region at the second end of the body portion and a slotted portion having an outer diameter smaller than the outer diameter of the solid cylindrical portion of the sleeve and an increased diameter portion for contacting the outer conductor of the female connector inserted into the second end of the body portion.

5. The blind mate connector according to claim 4 wherein the means for retaining the sleeve comprises a retaining ring having an outer diameter corresponding substantially to the inner diameter of the relieved region of the body portion and disposed within the second end of the body portion at approximately the intersection of the solid cylindrical portion and the slotted portion of the sleeve.

6. A blind mate connector for interconnecting a test head and a calibration or fixture board in an electronic circuit tester, the connector comprising:

an electrically conductive approximately cylindrical body portion having a central axis and a first inner diameter, the body portion having an interior surface adapted to internally receive an outer conductor of one of a male and female connector at a first end of the body portion and a relieved region at a second end of the body portion, the body portion having a second inner diameter at the relieved region, the body portion also having an exterior surface comprising means for mounting the blind mate connector to the board;

an electrically conductive approximately cylindrical-solid center conductor having an axis corresponding to the central axis, the center conductor having one of a female and male end juxtaposed with the first end of the body portion and adapted to contact a center conductor of the one of the male and female connector inserted into the first end of the body portion and a male end juxtaposed with the second end of the body portion and adapted to contact a center conductor of a female connector inserted into the second end of the body portion, the center conductor of the blind mate connector having an exterior surface opposite the interior surface of the body portion, the center conductor having a diameter less than the first inner diameter of the body portion to provide an interstitial region between the body portion and the center conductor of the blind mate connector;

the female connector inserted into the second end of the body portion being a compliantly mounted connector comprising:

a skirt integral with the outer conductor of the female connector, the skirt residing in a first portion of a cylinder provided in the test head; a spring disposed in a second portion of the cylinder, the first and second portions of the cylinder being separated by an iris; and a collar mounted to the outer conductor of the female connector between the outer conductor of the female connector and the spring so that the spring is captured between the iris and a lip of the collar;

the spring biasing the collar and, hence, the female connector away from the iris toward the blind mate connector, extension of the female connector toward the blind mate connector being limited by the skirt encountering the iris;

whereby the female connector moves axially in the first and second cylinder portions of the cylinder so that connection between the outer conductor of the female connector is effected with an increased diameter portion of the sleeve of the blind mate connector;

dielectric material disposed in the interstitial region for supporting the center conductor of the blind mate connector within the body portion;

an electrically conductive approximately cylindrical sleeve having an axis corresponding to the central axis the sleeve having an internal surface and an external surface, the sleeve being disposed in the relieved region at the second end of the body portion in electrical contact with the body portion, the sleeve adapted to contact an outer conductor of the female connector inserted into the second end of the body portion; and means for retaining the sleeve in the body portion when the sleeve is mounted within the body portion.

* * * * *